US009355981B2

(12) United States Patent
Lee et al.

(10) Patent No.: US 9,355,981 B2
(45) Date of Patent: May 31, 2016

(54) SEMICONDUCTOR DEVICE (75) Inventors: Min Jae Lee, Seoul (KR); You Shin Chung, Chungcheongnam-do (KR); Hoon Jung, Gwangju (KR)

(73) Assignee: AMKOR TECHNOLOGY, INC.

( * ) Notice: Subject to any disclaimer, the term of this patent is extended or adjusted under 35 U.S.C. 154(b) by 231 days.

(21) Appl. No.: 13/596,322

(22) Filed: Aug. 28, 2012

(65) Prior Publication Data

US 2013/0037945 A1 Feb. 14, 2013

Related U.S. Application Data (63) Continuation of application No. 13/566,082, filed on Aug. 3, 2012.

(30) Foreign Application Priority Data

Aug. 8, 2011 (KR) .......................... 10-2011-0078583

(51) Int. Cl.
*H01L 21/00* (2006.01)
*H01L 23/00* (2006.01)
(Continued)

(52) U.S. Cl.
CPC .......... *H01L 24/17* (2013.01); *H01L 23/49816* (2013.01); *H01L 24/14* (2013.01); *H05K 3/3452* (2013.01); *H01L 23/49838* (2013.01); *H01L 24/16* (2013.01); *H01L 2224/0401* (2013.01); *H01L 2224/05553* (2013.01); *H01L 2224/05567* (2013.01); *H01L 2224/131* (2013.01); *H01L 2224/13014* (2013.01); *H01L 2224/13022* (2013.01); *H01L 2224/13082* (2013.01); *H01L 2224/13147* (2013.01); *H01L 2224/1412* (2013.01); *H01L 2224/14133* (2013.01);

(Continued)

(58) Field of Classification Search
CPC ......... H01L 24/16; H01L 24/17; H01L 24/14; H01L 23/49816; H01L 23/49838
See application file for complete search history.

(56) References Cited

U.S. PATENT DOCUMENTS 7,586,182 B2 * 9/2009 Baek et al. .................... 257/686
2006/0216860 A1 * 9/2006 Pendse ......................... 438/108
(Continued)

FOREIGN PATENT DOCUMENTS

JP 11-097827 9/1999

OTHER PUBLICATIONS

Korean Office Action dated Nov. 28, 2012 corresponding to Korean Patent Application No. 10-2011-0078583, 3 pages.

*Primary Examiner* — Nicholas Tobergte
(74) *Attorney, Agent, or Firm* — McAndrews, Held & Malloy, Ltd.

(57) ABSTRACT

Provided is a semiconductor device in which misalignment between a semiconductor die and a substrate (e.g., a circuit board) can be prevented or substantially reduced when the semiconductor die is attached to the circuit board. In a non-limiting example, the semiconductor device includes: a semiconductor die comprising at least one bump; and a circuit board comprising at least one circuit pattern to which the bump is electrically connected. In a non-limiting example, the circuit board comprises: an insulation layer comprising a center region and peripheral regions around the center region; a plurality of center circuit patterns formed in the center region of the insulation layer; and a plurality of peripheral circuit patterns formed in the peripheral regions of the insulation layer. The center circuit patterns may be formed wider than the peripheral circuit patterns, formed in a zigzag pattern, and/or may be formed in a crossed shape.

20 Claims, 5 Drawing Sheets

(51) Int. Cl.
*H05K 3/34* (2006.01)
*H05K 3/30* (2006.01)
*H01L 23/498* (2006.01)

(52) U.S. Cl.
CPC ............... *H01L2224/16105* (2013.01); *H01L 2224/16238* (2013.01); *H01L 2224/73204* (2013.01); *H01L 2224/814* (2013.01); *H01L 2224/81191* (2013.01); *H01L 2224/81203* (2013.01); *H01L 2224/81815* (2013.01); *H01L 2924/00014* (2013.01); *H05K 3/303* (2013.01); *H05K 2201/09418* (2013.01); *H05K 2201/10674* (2013.01); *H05K 2201/10977* (2013.01); *H05K 2203/166* (2013.01)

(56) References Cited

U.S. PATENT DOCUMENTS

| | | | |
|---|---|---|---|
| 2007/0047377 A1* | 3/2007 | Bang et al. | 365/233 |
| 2008/0284009 A1* | 11/2008 | Min | 257/737 |
| 2009/0057887 A1* | 3/2009 | Mclellan et al. | 257/737 |
| 2011/0084386 A1* | 4/2011 | Pendse | 257/737 |

* cited by examiner

SEMICONDUCTOR DEVICE

CROSS-REFERENCE TO RELATED APPLICATIONS/INCORPORATION BY REFERENCE

The present application is a CONTINUATION of U.S. application Ser. No. 13/566,082, filed Aug. 3, 2012. Said U.S. application Ser. No. 13/566,082 makes reference to, claims priority to, and claims the benefit of Korean Patent Application No. 10-2011-0078583, filed on Aug. 8, 2011.

The above-identified applications are hereby incorporated herein by reference in their entirety.

FEDERALLY SPONSORED RESEARCH OR DEVELOPMENT

[Not Applicable]

SEQUENCE LISTING

[Not Applicable]

MICROFICHE/COPYRIGHT REFERENCE

[Not Applicable]

BACKGROUND

Present systems, methods and/or architectures for maintaining alignment during attachment of a semiconductor die are inadequate. Further limitations and disadvantages of conventional and traditional approaches will become apparent to one of skill in the art, through comparison of such approaches with the present invention as set forth in the remainder of the present application with reference to the drawings.

DETAILED DESCRIPTION OF VARIOUS ASPECTS OF THE INVENTION

Example embodiments will now be described more fully hereinafter with reference to the accompanying drawings. However, the various aspects of the present invention may be embodied in different forms, and thus the provided exemplary embodiments should not be construed as limiting.

Figure 1:
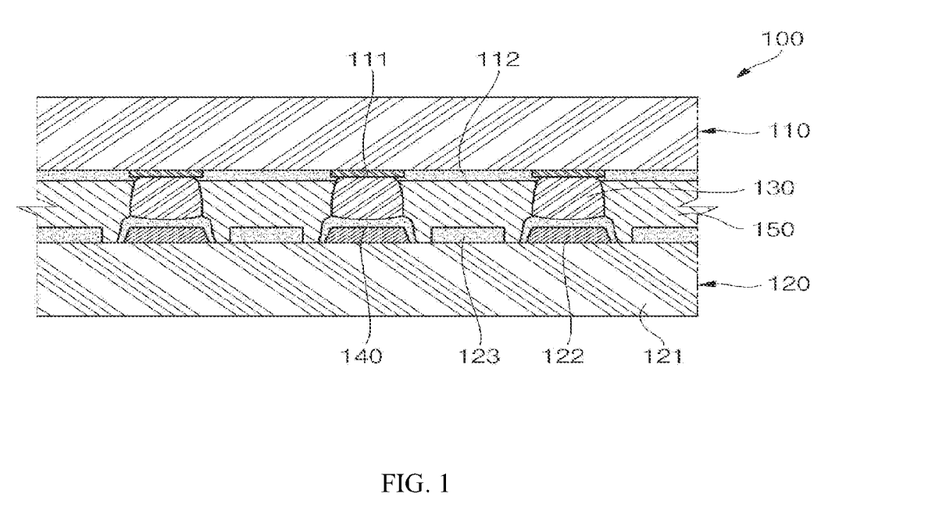
FIG. 1 shows a partial sectional view illustrating a semiconductor device, in accordance with various aspects of the present invention.

FIG. 1 shows a partial sectional view illustrating a semiconductor device 100, in accordance with various aspects of the present invention.

Referring to FIG. 1, the exemplary semiconductor device 100 includes a semiconductor die 110, a circuit board 120, and a nonconductive paste 150.

The semiconductor die 110 includes a plurality of bond pads 111 formed a lower surface thereof, and a protection layer 112 covering the outsides of the bond pads 111. In addition, the semiconductor die 110 further includes bumps 130 disposed on the bond pads 111. The bumps 130 (e.g., conductive bumps) may, for example and not limitation, be formed of solder (SnPb), copper (Cu), and/or any of a variety of bumping materials.

The circuit board 120 (for example, a printed wire board, a semiconductor packaging substrate made from any of a variety of non-semiconductor and/or semiconductor materials, etc.) includes an insulation layer 121, a plurality of circuit patterns 122 disposed on the topside of the insulation layer 121, and a protection layer 123 formed on the outsides of the circuit patterns 122. Note that the various aspects of the present invention disclosed herein may also be applied to die-to-die attachment.

The bumps 130 of the semiconductor die 110 may be connected to the circuit patterns 122 of the circuit board 120 through respective solder joints 140.

The nonconductive paste 150 is disposed between the semiconductor die 110 and the circuit board 120. The nonconductive paste 150 functions to, for example, strongly couple the semiconductor die 110 and the circuit board 120. Additionally for example, the nonconductive paste 150 prevents the solder corresponding to the solder joints 140 from flowing to undesired regions when the bumps 130 and the circuit patterns 122 are connected using the solder joints 140.

Before electrically connecting the bumps 130 and the circuit patterns 122, solder caps may be disposed on the lower ends of the bumps 130 and/or solder paste may be deposited on the circuit patterns 122. For example, the circuit patterns 122 may be completely or mostly covered with the solder paste deposits.

In an exemplary process for electrically connecting the bumps 130 and the circuit patterns 122, the solder caps of the bumps 130 are aligned with and brought into contact with respective solder paste deposits of the circuit patterns 122. Then at a high temperature (about 150° C. to 250° C.), for example also combined with pressure, the solder caps and the solder paste deposits reflow and cool to connect the bumps 130 and the circuit patterns 122 electrically and mechanically through respective solder joints 140.

Figure 2:
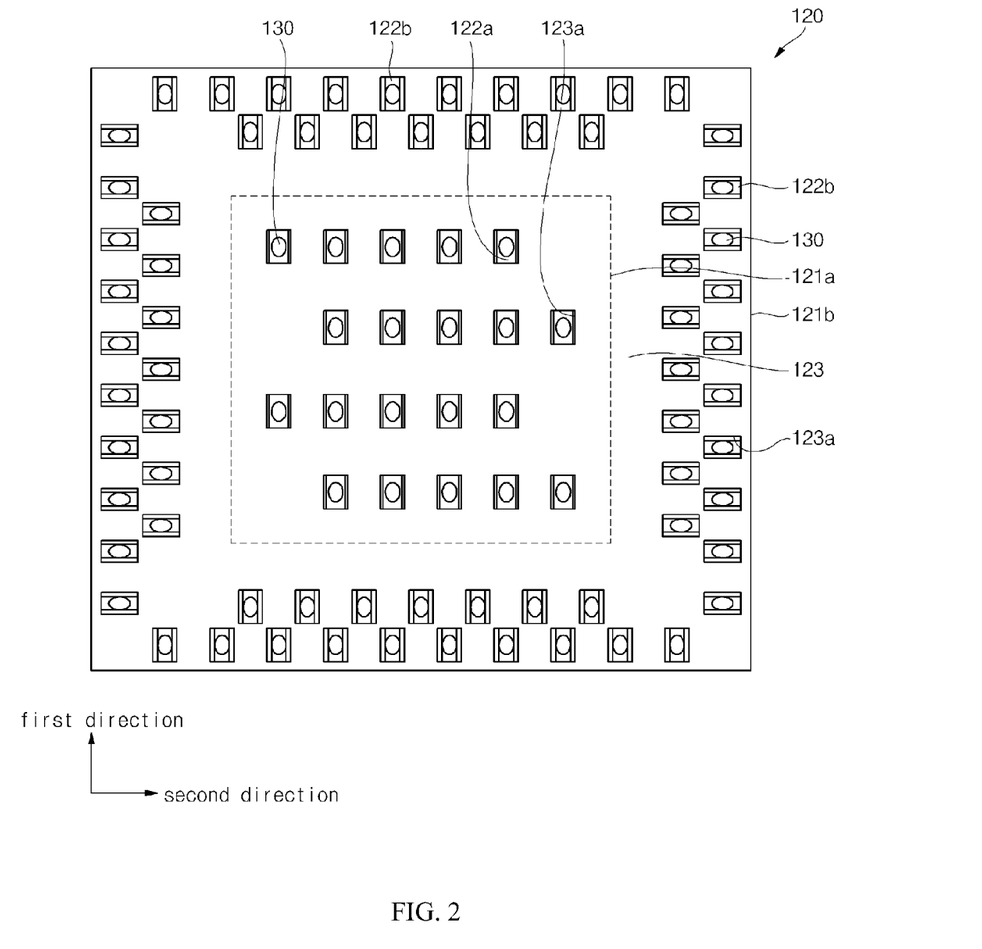
FIG. 2 shows a plan view illustrating a circuit board of the semiconductor device, in accordance with various aspects of the present invention.

Turning next to FIG. 2, such figure shows a plan view illustrating the circuit board 120 of the semiconductor device 100, in accordance with various aspects of the present invention.

As described above with regard to FIG. 1, the circuit board 120 includes the insulation layer 121. For clarity in explanation, it is defined that the insulation layer 121 includes a center region 121a and four peripheral regions 121b around the center region 121a. The four peripheral regions 121b, might be described herein using left, right, top, and bottom terminology in reference to their relative locations on the page when viewing FIG. 2.

In addition, it is defined that the circuit patterns 122 include a plurality of center circuit patterns 122a formed in the center region 121a of the insulation layer 121 and a plurality of peripheral circuit patterns 122b formed in the peripheral regions 121b of the insulation layer 121. The center circuit patterns 122a and the peripheral circuit patterns 122b may be connected to each other or might not be connected to each other.

The center circuit patterns 122a and the peripheral circuit patterns 122b formed on the insulation layer 121 may, for example, be generally covered with the protection layer 123, but portions of the circuit patterns 122a and 122b connected to the bumps 130, and for example peripheries of such portions, may be exposed. The exposed portions and the peripheries thereof are defined as openings 123a, and the openings 123a may, for example, have a rectangular shape (for example with sharp and/or rounded corners). Note that the rectangular shape is illustrative and that the various aspects of the present invention also apply to other opening shapes, for example elliptical shapes, general shapes having a major and minor axis, etc.

Although it is shown that the circuit patterns 122 are formed within the openings 123a, the circuit patterns 122 may extend outward from the openings 123a.

As described above, the center circuit patterns 122a and the peripheral circuit patterns 122b are electrically connected to the bumps 130. In the example illustrated in FIG. 2, the bumps 130 have an elliptical shape. Although the bumps 130 may have a circular shape, it may be effective in terms of fine pitch when the bumps 130 have an elliptical shape.

As shown in FIG. 2, the circuit patterns 122 include first-direction peripheral circuit patterns 122b. The first-direction peripheral circuit patterns 122b are disposed in first peripheral regions 121b (for example, the upper and lower peripheral regions 121b as illustrated in FIG. 2) that face each other, and the lengths of the first-direction peripheral circuit patterns 122b (e.g., the major axes along the longest dimensions of such circuit patterns) are parallel with a first direction. In addition, the circuit patterns 122 include second-direction peripheral circuit patterns 122b. The second-direction peripheral circuit patterns 122b are disposed in mutually-facing second peripheral regions 121b (for example, the left and right peripheral regions 121b as illustrated in FIG. 2) different from the first peripheral regions 121b, and the lengths of the second-direction peripheral circuit patterns 122b (e.g., the major axes along the longest dimensions of such circuit patterns) are parallel with a second direction different from the first direction. The first direction and the second direction may, for example, be approximately or substantially orthogonal. For example, the first and second directions may be within 1 degree of orthogonality, within 2 degrees of orthogonality, within 5 degrees of orthogonality, etc.

In addition, as shown in FIG. 2, the lengths of the center circuit patterns 122a are parallel with the first direction, and the widths (e.g., along the minor axes) of the center circuit patterns 122a are greater than those of the peripheral circuit patterns 122b.

For example, the widths of the center circuit patterns 122a may be about 1.5 times to about 2.5 times the widths of the peripheral circuit patterns 122b. If the widths of the center circuit patterns 122a are smaller than about 1.5 times the widths of the peripheral circuit patterns 122b, misalignment may be less improved. Likewise, if the widths of the center circuit patterns 122a are greater than about 2.5 times the widths of the peripheral circuit patterns 122b, misalignment may be less improved, and the circuit patterns 122 are too close.

For example, in one non-limiting exemplary implementation, the widths of the peripheral circuit patterns 122b may be about 16 μm, and the widths of the center circuit patterns 122a may be 30 μm. However, the scope of various aspects of the present invention is not limited to those values nor to their corresponding ratio, unless explicitly claimed.

In the following exemplary illustrations, the widths of center circuit patterns may similarly be greater than the widths of peripheral circuit patterns, as in the present example. Furthermore, in the following embodiments, the directions of peripheral circuit patterns are the same as those described in the current embodiment, and thus descriptions thereof will not be given.

Figure 3:
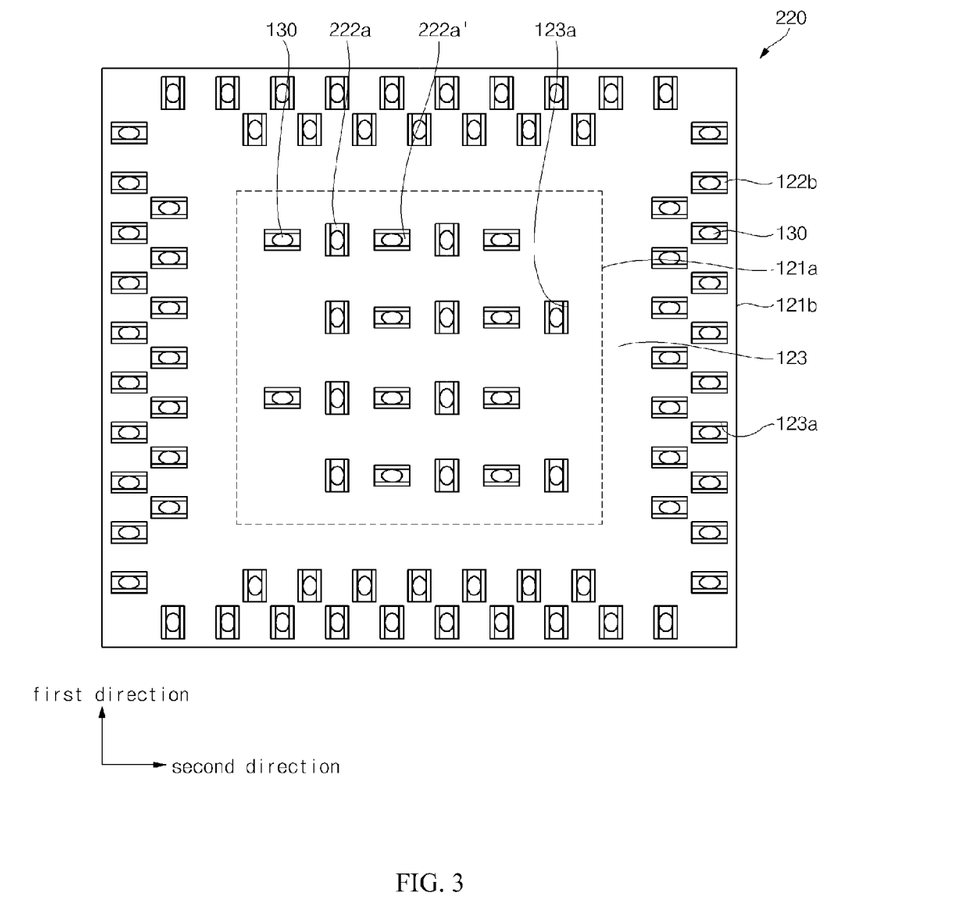
FIG. 3 shows a plan view illustrating a circuit board of a semiconductor device, in accordance with various aspects of the present invention.

Turning next to FIG. 3, such figure shows a plan view illustrating a circuit board 220 of a semiconductor device, in accordance with various aspects of the present invention. The circuit board 220 may, for example, share any or all characteristics with the circuit board 120 illustrated in FIGS. 1-2 and discussed previously.

Referring to FIG. 3, a plurality of center circuit patterns 222a formed on the circuit board 220 include: first-direction center circuit patterns 222a, the major axes of which are parallel with a first direction; and second-direction center circuit patterns 222a', the major axes of which are parallel with a second direction different from the first direction. The first direction and the second direction may be approximately or substantially orthogonal. For example, the first and second directions may be within 1 degree of orthogonality, within 2 degrees of orthogonality, within 5 degrees of orthogonality, etc.

The first-direction center circuit patterns 222a and the second-direction center circuit patterns 222a' may, for example, be generally or exactly equal in quantity. For example, if the number of the first-direction center circuit patterns 222a is 10, the number of the second-direction center wiring patters 222a' may be about 10.

The arrangement of the center circuit patterns shown in FIG. 3 may be referred to as a zigzag shape. Note that although the center circuit patterns 222a and 222a' are illustrated in only two directions, for example for illustrative clarity, they may be arranged in any number of directions. For example, such circuit patterns may be formed in four sets of four different directions, eight sets of eight different directions, etc.

Figure 4:
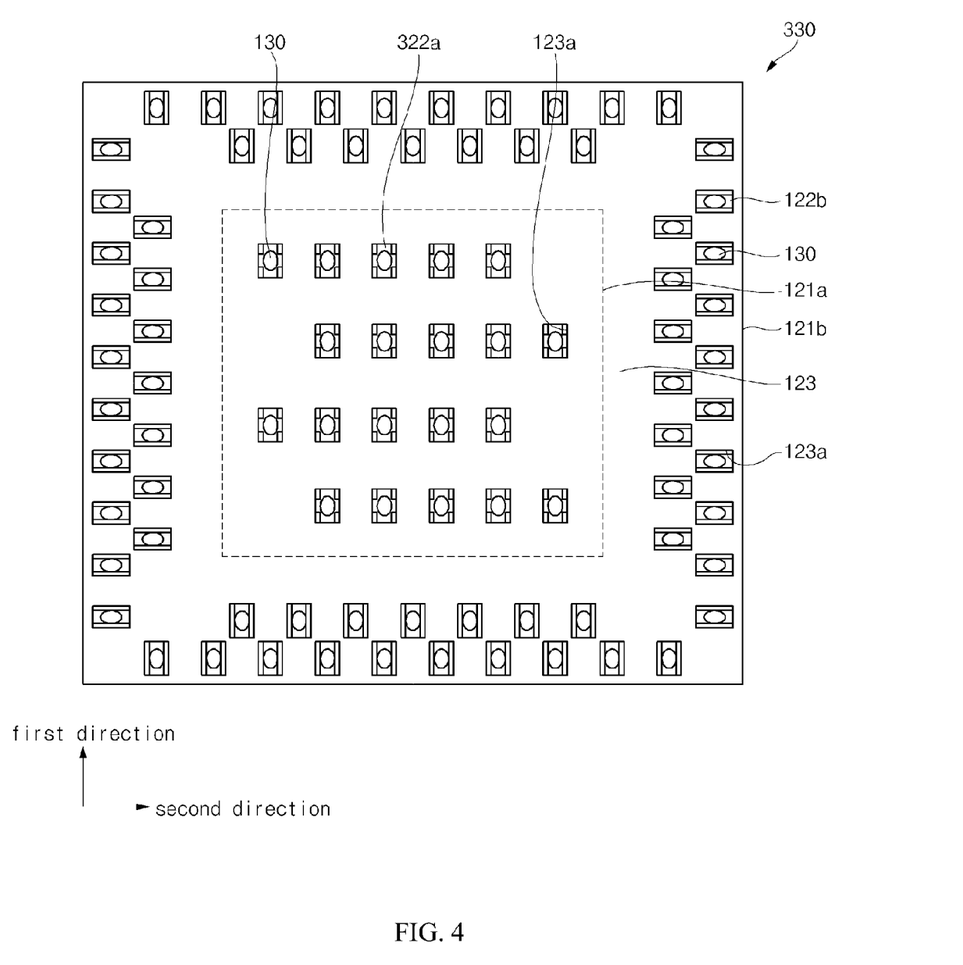
FIG. 4 shows a plan view illustrating a circuit board of a semiconductor device, in accordance with various aspects of the present invention.

Turning next to FIG. 4, such figure shows a plan view illustrating a circuit board 330 of a semiconductor device, in accordance with various aspects of the present invention. The circuit board 330 may, for example, share any or all characteristics with the circuit boards 120 and 220 shown in FIGS. 1-3 and discussed previously.

A plurality of center circuit patterns 322a formed on the circuit board 330 may have a crossed shape in first and second directions. For example, as shown in FIG. 4, the center circuit patterns 322a may have a crossed shape in which linear circuit patterns intersect each other. Although not shown in FIG. 4, the center circuit patterns 322a may have a crossed shape in three, four, or more directions. In this example, bumps 130 may be connected to the centers of the center circuit patterns 322a.

As described above, according to the semiconductor device 100 of the embodiments, when the semiconductor die 110 is attached to the circuit board 120, 220, or 330 (e.g., by thermal compression bonding), misalignment between the semiconductor die 110 and the circuit board 120, 220, or 330 can be prevented or at least substantially reduced.

For example, as shown in Table 1 below, in the case of center circuit patterns having an increased width (refer to FIG. 2), 89.69% of samples were satisfactorily aligned, and 20% misalignment and 40% misalignment that are acceptable for products were found in 9.16% and 1.16% of the samples, respectively. Misalignments of 60% and 80%, which are generally not acceptable for products, were not found.

Furthermore, in the case of center circuit patterns having an increased width and zigzag shape (refer to FIG. 3), 94.5% of samples were satisfactorily aligned, and 20% misalignment and 40% misalignment that are acceptable for products were found in 4.85% and 0.65% of the samples, respectively. Misalignments of 60% and 80%, which are generally not acceptable for products, were not found.

In the case of the center circuit patterns having an increased width and zigzag shape, more samples were satisfactorily aligned as compared with the case of the center circuit patterns having only an increased width.

However, in the case of prior circuit pattern arrangements, only 64.36% of samples were satisfactorily aligned, and 20% misalignment and 40% misalignment that are acceptable for products were found in 32.48% and 3.66% of the samples, respectively. Misalignments of 60% and 80%, which are generally not acceptable for products, were found in 0.4% and 0.1% of the samples, respectively.

TABLE 1

| Circuit pattern type | Satisfactory alignment | Misalignment 20% | 40% | 60% | 80% | 100% | Total units |
|---|---|---|---|---|---|---|---|
| Increased width | 4484 ea (89.69%) | 458 ea (9.16%) | 58 ea (1.16%) | 0 | 0 | 0 | 5000 ea |
| Increased width & zigzag shape | 4725 ea (94.5%) | 253 ea (4.85%) | 32 ea (0.65%) | 0 | 0 | 0 | 5000 ea |
| Prior Pattern | 3168 ea (63.36%) | 1624 ea (32.48%) | 183 ea (3.66%) | 20 ea (0.4%) | 5 ea (0.1%) | 0 | 5000 ea |

As described above, according to the semiconductor device 100 of the embodiments, when the semiconductor die 110 is attached to the circuit board 120 (or 220 or 330) by thermal compression, misalignment between the semiconductor die 110 and the circuit board 120 (or 220 or 330) can be significantly reduced.

FIGS. 5A through 5D show views illustrating misalignment between bumps and circuit patterns.

Figure 5A:
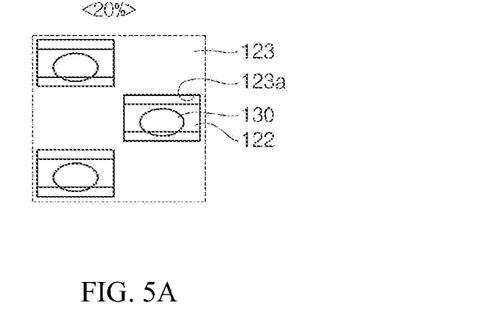
FIGS. 5A through 5D show views illustrating misalignment between bumps and circuit patterns.

As shown in FIG. 5A, 20% misalignment means the case where a bump 130 is misaligned with a circuit pattern 122 by about 20%.

Figure 5B:
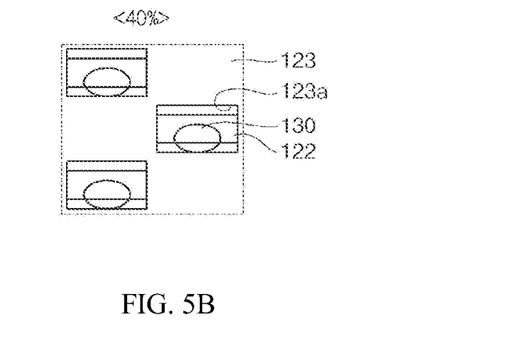

As shown in FIG. 5B, 40% misalignment means the case where a bump 130 is misaligned with a circuit pattern 122 by about 40%.

Figure 5C:
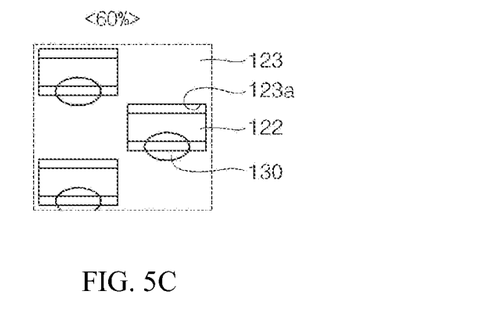

As shown in FIG. 5C, 60% misalignment means the case where a bump 130 is misaligned with a circuit pattern 122 by about 60%.

Figure 5D:
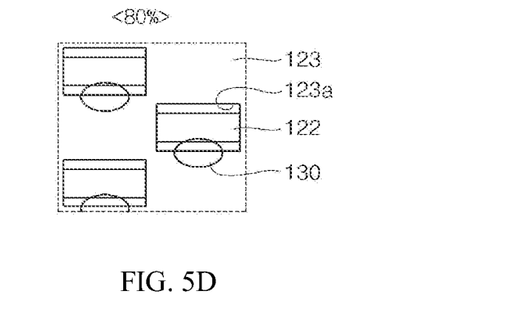

As shown in FIG. 5D, 80% misalignment means the case where a bump 130 is misaligned with a circuit pattern 122 by about 80%.

Generally, if a bump 130 is misaligned with a circuit pattern 122 by 60% or more, the semiconductor device is unacceptable as a product because the electric contact area between the bump 130 and the circuit pattern 122 is too small.

As described above, in a semiconductor device formed in accordance with various aspects of the present invention, when the semiconductor die is attached to the circuit board (e.g., by thermal compression bonding), misalignment can be prevented, or at least substantially reduced, between the semiconductor die and the circuit board.

Non-limiting illustrative examples of a semiconductor device have been disclosed herein, and although specific terms are employed, they are used and are to be interpreted in a generic and descriptive sense only and not for purpose of limitation. Accordingly, it will be understood by those of ordinary skill in the art that various changes in form and details may be made without departing from the spirit and scope of the present disclosure as set forth in the following claims.

What is claimed is:

1. A semiconductor device package comprising:
   a package substrate comprising:
   a first circuit pattern for connection to a first conductive bump of a semiconductor die that electrically connects the semiconductor die to the first circuit pattern;
   a second circuit pattern for connection to a second conductive bump of the semiconductor die that electrically connects the semiconductor die to the second circuit pattern, where the second circuit pattern is adjacent to the first circuit pattern and runs parallel to the first circuit pattern;
   a protection layer;
   a first opening in the protection layer that exposes at least a portion of the first circuit pattern for connection with the first conductive bump, wherein the first opening is substantially longer in a first direction with which a major axis of the first opening is aligned than in a second direction with which a minor axis of the first opening is aligned, the first circuit pattern is the only circuit pattern exposed by the first opening, and the first opening is the only opening in the protection layer for receiving the first conductive bump; and
   a second opening in the protection layer that exposes at least a portion of the second circuit pattern for connection with the second conductive bump, wherein the second opening is substantially longer in the first direction with which a major axis of the second opening is aligned than in the second direction with which a minor axis of the second opening is aligned, the second circuit pattern is the only circuit pattern exposed by the second opening, and the second opening is the only opening in the protection layer for receiving the second conductive bump.

2. The semiconductor device package of claim 1, wherein the first and second openings are rectangular-shaped.

3. The semiconductor device package of claim 2, wherein the first and second rectangular-shaped openings comprise rounded corners.

4. The semiconductor device package of claim 1, wherein the first and second openings are elliptical-shaped.

5. The semiconductor device package of claim 1, further comprising the semiconductor die, wherein the first and second conductive bumps are elliptical-shaped.

6. The semiconductor device package of claim 1, wherein:
   the first circuit pattern and the second circuit pattern are adjacent to each other on the package substrate in the second direction; and
   the first opening and the second opening are offset relative to each other in the first direction and in the second direction.

7. The semiconductor device package of claim 1, comprising:
- a third opening formed in the protection layer that exposes at least a portion of a third circuit pattern of the package substrate for connection with a third conductive bump of the semiconductor die, and the third circuit pattern is the only circuit pattern exposed by the third opening; and
- a fourth opening formed in the protection layer that exposes at least a portion of a fourth circuit pattern of the package substrate for connection with a fourth conductive bump of the semiconductor die, and the fourth circuit pattern is the only circuit pattern exposed by the fourth opening,
- wherein the first opening, the second opening, the third opening, and the fourth opening are arranged in a zigzag pattern with no other openings positioned between them.

8. The semiconductor device package of claim 1, wherein:
- the portion of the first circuit pattern exposed by the first opening has straight continuous sides and a width no greater than 16 um; and
- the portion of the second circuit pattern exposed by the second opening has straight continuous sides and a width no greater than 16 um.

9. The semiconductor device package of claim 8, wherein the first and second openings are greater than 16 um in width and expose the entire widths of the first and second circuit patterns.

10. The semiconductor device package of claim 1, wherein the package substrate comprises a circuit board.

11. A substrate for use in semiconductor device packaging, the substrate comprising:
- a base material;
- a first circuit pattern on the base material for connection to a first conductive bump of a semiconductor die that electrically connects the semiconductor die to the first circuit pattern;
- a second circuit pattern on the base material for connection to a second conductive bump of a semiconductor die that electrically connects the semiconductor die to the second circuit pattern, where the second circuit pattern is adjacent to the first circuit pattern and runs parallel to the first circuit pattern;
- a protection layer on the base material,
- a first opening in the protection layer that exposes at least a portion of the first circuit pattern for connection with the first conductive bump, wherein the first opening is substantially longer in a first direction with which a major axis of the first opening is aligned than in a second direction with which a minor axis of the first opening is aligned, the first circuit pattern is the only circuit pattern exposed by the first opening, and the first opening is the only opening in the protection layer for receiving the first conductive bump; and
- a second opening in the protection layer that exposes at least a portion of the second circuit pattern for connection with the second conductive bump, wherein the second opening is substantially longer in the first direction with which a major axis of the second opening is aligned than in the second direction with which a minor axis of the second opening is aligned, the second circuit pattern is the only circuit pattern exposed by the second opening, and the second opening is the only opening in the protection layer for receiving the second conductive bump.

12. The substrate of claim 11, wherein the first and second openings are rectangular-shaped and comprise rounded corners.

13. The substrate of claim 11, wherein the first and second openings are elliptical-shaped.

14. The substrate of claim 11, further comprising the semiconductor die, wherein the first and second conductive bumps are elliptical-shaped.

15. The substrate of claim 11, wherein:
- the first circuit pattern and the second circuit pattern are adjacent to each other on the base material in the second direction; and
- the first opening and the second opening are offset relative to each other in the first direction and in the second direction.

16. The substrate of claim 11, comprising:
- a third opening formed in the protection layer that exposes at least a portion of a third circuit pattern formed on the base material for connection with a third conductive bump of the semiconductor die, and the third circuit pattern is the only circuit pattern exposed by the third opening; and
- a fourth opening formed in the protection layer that exposes at least a portion of a fourth circuit pattern formed on the base material for connection with a fourth conductive bump of the semiconductor die, and the fourth circuit pattern is the only circuit pattern exposed by the fourth opening,
- wherein the first opening, the second opening, the third opening, and the fourth opening are arranged in a zigzag pattern with no other openings positioned between them.

17. The substrate of claim 11, wherein:
- the portion of the first circuit pattern exposed by the first opening has straight continuous sides and a width no greater than 16 um; and
- the portion of the second circuit pattern exposed by the second opening has straight continuous sides and a width no greater than 16 um.

18. The substrate of claim 17, wherein the first and second openings are greater than 16 um in width and expose the entire widths of the first and second circuit patterns.

19. The substrate of claim 11, wherein the base material is a circuit board material.

20. A semiconductor device comprising:
- a semiconductor die comprising a conductive bump that is elliptical-shaped; and
- a package substrate comprising:
    - a circuit pattern to which the conductive bump is electrically connected, wherein the conductive bump electrically connects the semiconductor die to the circuit pattern, and the circuit pattern is narrower than the elliptical-shaped conductive bump;
    - a protection layer; and
    - an opening formed in the protection layer that exposes at least a portion of the circuit pattern for connection with the conductive bump, wherein the opening is substantially longer in a first direction than in a second direction, the circuit pattern is the only circuit pattern exposed by the opening, and said opening is the only opening in said protection layer for receiving the conductive bump.

* * * * *